(12) United States Patent
Tanner et al.

(10) Patent No.: US 8,791,052 B2
(45) Date of Patent: Jul. 29, 2014

(54) WIDE ELECTRICAL CONDUCTOR HAVING HIGH C-AXIS STRENGTH

(75) Inventors: Michael A. Tanner, Westborough, MA (US); Gregory L. Snitchler, Shrewsbury, MA (US); William L. Carter, Chelmsford, MA (US); Eric R. Podtburg, Natick, MA (US)

(73) Assignee: American Superconductor Corporation, Devens, MA (US)

( * ) Notice: Subject to any disclaimer, the term of this patent is extended or adjusted under 35 U.S.C. 154(b) by 168 days.

(21) Appl. No.: 13/435,156

(22) Filed: Mar. 30, 2012

(65) Prior Publication Data

US 2013/0261000 A1   Oct. 3, 2013

(51) Int. Cl.
*H01L 39/24*   (2006.01)

(52) U.S. Cl.
USPC ......................................... 505/237; 505/230

(58) Field of Classification Search
USPC ........... 428/699–701; 505/230–232, 237–238
See application file for complete search history.

(56) References Cited

U.S. PATENT DOCUMENTS

| 5,777,420 | A | 7/1998 | Gamble et al. |
| 6,759,781 | B1 | 7/2004 | Bushko et al. |
| 7,816,303 | B2 | 10/2010 | Thieme et al. |
| 2006/0073979 | A1 | 4/2006 | Thieme et al. |

OTHER PUBLICATIONS

Staudenmann, et al. "Technical Innovations Enabling a New Direct Drive Wind Turbing Generator—Advanced Technology Program" (Jun. 30, 2010) 28 pages.

*Primary Examiner* — Colleen Dunn
(74) *Attorney, Agent, or Firm* — Occhiuti & Rohlicek LLP

(57) ABSTRACT

A rotating machine includes a stator and a rotor configured to rotate within the stator. Rotor windings are supported in the rotor and are formed of a laminated electrical conductor in a single-layer saddle coil configuration. The conductor includes a first support lamina, a second support lamina, an insert including a high temperature superconductor disposed between the first and second support lamina, and a filler material surrounding the insert that bonds the insert to each of the first and second support lamina. At the location between the first support lamina and second support lamina corresponding to the location of the insert, the width dimension of the filler material on each side of the insert is at least 10 percent of a width of the conductor. The conductor is configured to carry at least 600 Amperes per turn and have a C-axis tensile strength of at least 21 MPa.

14 Claims, 10 Drawing Sheets

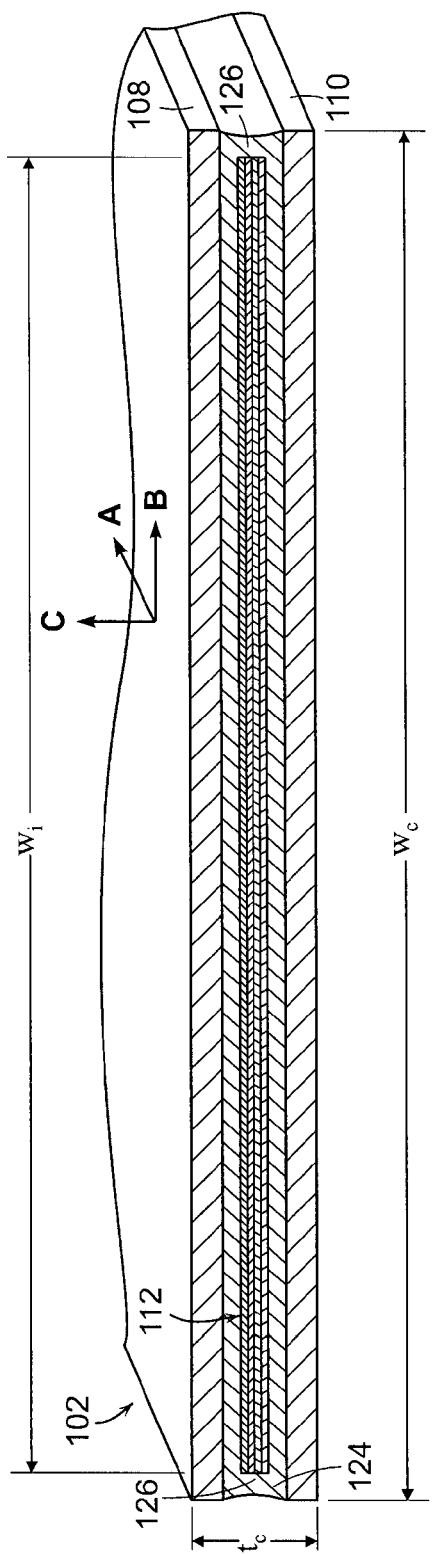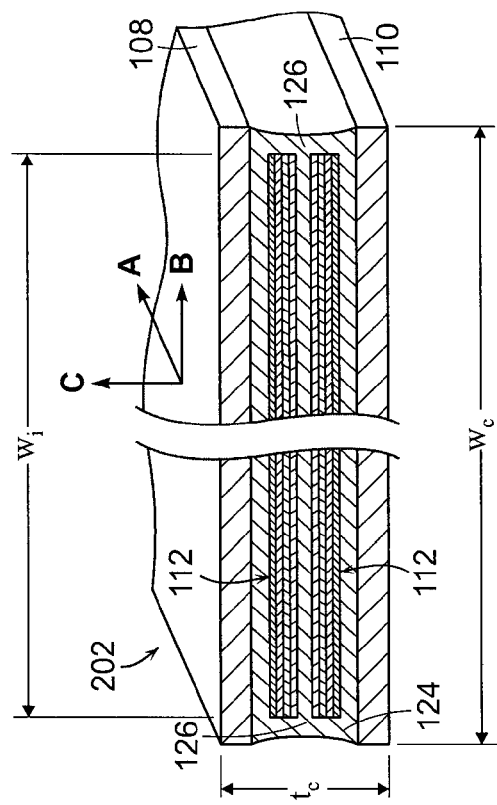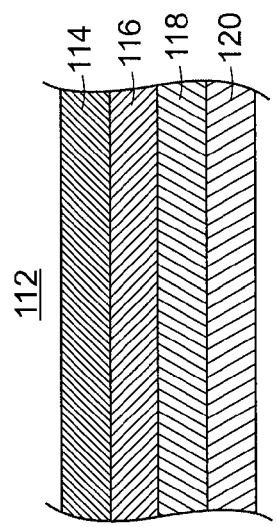
FIG. 6
FIG. 9
FIG. 7

WIDE ELECTRICAL CONDUCTOR HAVING HIGH C-AXIS STRENGTH

BACKGROUND OF THE INVENTION

Power generation continues to be an important application of rotating electrical machines. Wind energy is one of the fastest growing sources of electricity around the world, and wind turbines employing rotating electrical machines are used to convert wind energy to usable power. Some conventional wind turbines include a turbine rotor having turbine blades and an output shaft which drive an electrical machine that can supply 3-5 Megawatts of power to the utility power network. However, increased power demand is leading to increased power requirements for each wind turbine. To obtain a wind turbine that can deliver 10 Megawatts or more, a mere scaling up of the size of the conventional geared power train becomes impractical, due at least in part to the size, weight, cost and potential unreliability of a gearbox which can accommodate these requirements.

High temperature superconducting (HTS) coil windings are proposed for use in ultra low speed, direct drive generators for wind turbines that can produce power at levels of 10 megawatts (MW) or more. In order to achieve power production at this rate, improved HTS electrical conductors used to form the coil winding may be required.

Design and fabrication of HTS electrical conductors for use in power transmission cable applications has been focused on providing a cable having low loss, high current transmission over great distances, as well as providing a cable having some flexibility. The design and fabrication techniques for forming HTS electrical conductors are also used to form electrical conductors used in coil windings of generators used in power generation applications. However, since the arrangement and loading conditions of an electrical conductor in use within a power transmission cable is quite different than that of a conductor within a generator coil winding, HTS electrical conductors adapted for use in coil windings are required.

SUMMARY

In some aspects, a laminated electrical conductor is provided that includes a first support lamina; a second support lamina; an insert including a high temperature superconductor disposed between the first support lamina and the second support lamina; and a filler material surrounding the insert that bonds the insert to each of the first support lamina and the second support lamina. At the location between the first support lamina and second support lamina corresponding to the location of the insert, the width dimension of the filler material on each side of the insert is at least 10 percent of a width of the laminated electrical conductor.

In some aspects, a laminated electrical conductor has an A-axis extending in a direction corresponding to a conductor length, and a B-axis transverse to the A-axis. The B-axis extends in a direction corresponding to a conductor width. The conductor has a c axis transverse to both the A-axis and the B-axis, the C axis extending in a direction corresponding to a conductor thickness. The laminated electrical conductor includes a first support lamina having a width corresponding to the laminated electrical conductor width; a second support lamina arranged in a layered configuration along the C axis relative to the first support lamina; an insert including a high temperature superconductor disposed between the first support lamina and the second support lamina; and a filler material surrounding the insert that bonds the insert to each of the first support lamina and the second support lamina. At the location between the first support lamina and second support lamina corresponding to the location of the insert, the width dimension of the filler material on each side of the insert is at least 10 percent of a width of the laminated electrical conductor.

The laminated electrical conductor may include one or more of the following features: The filler material is solder. At least one of the first support lamina and the second support lamina is formed of an electrically conductive material. The first support lamina is formed of a different material than the second support lamina. The laminated electrical conductor further includes a second insert including a high temperature superconductor disposed between the first support lamina and the second support lamina. At least one of the first support lamina and the second support lamina has a width of at least 12 mm and the insert has a width of at least 9 mm. At least one of the first support lamina and the second support lamina has a width of at least 16 mm, and the insert has a width of at least 11.8 mm. The tensile strength of the laminated electrical conductor along an axis normal to the first support lamina is reliably at least 21 MPa, where the term "reliably at least 21 MPa" refers to a conductor having tensile test data along an axis normal to the first support lamina in which 99.7 percent of the tensile test data lies within three standard deviations of a mean of the tensile test data, and the difference between the mean of the tensile test data and three standard deviations of the mean of the tensile test data is at least 21 MPa. The C-axis tensile strength of the laminated electrical conductor is reliably at least 21 MPa, where the term "reliably at least 21 MPa" refers to a conductor having C-axis tensile test data in which 99.7 percent of the C-axis tensile test data lies within three standard deviations of a mean of the C-axis tensile test data, and the difference between the mean of the C-axis tensile test data and three standard deviations of the mean of the C-axis tensile test data is at least 21 MPa.

In some aspects, a rotating machine is provided that includes a stator assembly including at least one stator winding, and a rotor assembly configured to rotate within the stator assembly about a longitudinal axis of the rotating machine. The rotor assembly includes at least one rotor winding, each rotor winding including a single laminated electrical conductor. The laminated electrical conductor includes a cross-section defined by a B-axis extending in a direction corresponding to a conductor width, and a C axis orthogonal to the B-axis, the C axis extending in a direction corresponding to a conductor thickness, a first support lamina, a second support lamina, an insert including a high temperature superconductor disposed between the first support lamina and the second support lamina, and a filler material surrounding the insert that bonds the insert to each of the first support lamina and the second support lamina. At the location between the first support lamina and second support lamina corresponding to the location of the insert, the width dimension of the filler material on each side of the insert is at least 10 percent of a width of the laminated electrical conductor.

The rotating electrical machine may include one or more of the following features: The at least one rotor winding is supported within the rotor assembly such the conductor B-axis is parallel to a radius of the rotor assembly. The dimension of each rotor winding along the transverse axis is substantially the same as the B-axis dimension of the laminated electrical conductor. The laminated electrical conductor is configured to carry at least 600 Amperes per turn. The C-axis tensile strength of the laminated electrical conductor is reliably at least 21 MPa, where the term "reliably at least 21 MPa" refers to a conductor having C-axis tensile test data in which 99.7 percent of the C-axis tensile test data lies within three standard deviations of a mean of the C-axis tensile test data, and the difference between the mean of the C-axis tensile test data and three standard deviations of the mean of the C-axis tensile test data is at least 21 MPa.

In some aspects, a coil winding is provided that includes a single laminated electrical conductor. The laminated electrical conductor has a cross-section defined by a B-axis extending in a direction corresponding to a conductor width, and a C-axis orthogonal to the B-axis, the C-axis extending in a direction corresponding to a conductor thickness. The laminated electrical conductor includes a first support lamina, a second support lamina, an insert including a high temperature superconductor disposed between the first support lamina and the second support lamina, and a filler material surrounding the insert that bonds the insert to each of the first support lamina and the second support lamina. At the location between the first support lamina and second support lamina corresponding to the location of the insert, the width dimension of the filler material on each side of the insert is at least 10 percent of a width of the laminated electrical conductor.

The coil winding may include one or more of the following features: The laminated electrical conductor is wound about a winding axis that is substantially parallel to the B-axis. The dimension of each rotor winding along the winding axis is substantially the same as the B-axis dimension of the laminated electrical conductor. The laminated electrical conductor is configured to carry at least 600 Amperes per turn. The C-axis tensile strength of the laminated electrical conductor is reliably at least 21 MPa, where the term "reliably at least 21 MPa" refers to a conductor having C-axis tensile test data in which 99.7 percent of the C-axis tensile test data lies within three standard deviations of a mean of the C-axis tensile test data, and the difference between the mean of the C-axis tensile test data and three standard deviations of the mean of the C-axis tensile test data is at least 21 MPa. The coil winding further comprises plural turns of the laminated electrical conductor, each turn of the laminated electrical conductor fixed relative to the remaining turns using epoxy. The C-axis tensile strength of the laminated electrical conductor is reliably greater than the tensile strength of the epoxy, where the term "reliably reliably greater than the tensile strength of the epoxy" refers to a conductor having C-axis tensile test data in which 99.7 percent of the C-axis tensile test data lies within three standard deviations of a mean of the C-axis tensile test data, and the difference between the mean of the C-axis tensile test data and three standard deviations of the mean of the C-axis tensile test data is greater than the tensile strength of the epoxy. The coil winding is formed in the shape of a saddle coil winding. The winding is formed of a single conductor wound about an axis so as to be layered in the C-axis direction and to have a single thickness in the B-axis direction.

In generator coil winding applications, the C-axis strength is an important design consideration. This is due to loading conditions found in generator coil winding applications. More specifically, in these applications, the laminate conductor is wound about a mandrel to form a multi-turn generator coil winding. In the winding, the individual conductors are stacked along the C-axis, with an epoxy layer between each turn. In use, the generator coil winding is cryogenically cooled to permit superconductivity. However, since the epoxy layer tends to contract much more than the metals which form the laminate, a high C-axis stress is applied to the laminate which tends to delaminate the conductor. In particular, high C-axis stress frequently causes delamination to occur within the HTS insert such that the HTS layer peels off the metal substrate layer. By providing a laminated electrical conductor having a wide fillet structure, the C-axis strength of the conductor is greater than that of the epoxy, and delamination of the conductor due to cooling is avoided. In particular, it has been determined that a fillet width dimension on each side of the HTS insert of at least 10 percent of a width of the laminated electrical conductor is required to avoid delamination due to conductor cooling. This is in contrast to power transmission cable applications, where conductor loading conditions within a power transmission cable are quite different and thus the C-axis strength is not an important design consideration.

A laminated HTS electrical conductor is provided that has a C-axis strength that is reliably greater than 21 MPa. This is achieved by providing the laminate with a fillet width on each side of the conductor that is at least 10 percent of the width of the conductor. Advantageously, the laminate structure prevents delamination of the conductor when formed into a winding and sufficiently cooled to permit superconductivity.

A laminated HTS electrical conductor is provided that has a high current carrying capacity relative to conventional laminated high-temperature superconducting electrical conductors. This is achieved by providing the laminate with an overall conductor width that is greater than 12 mm. In some cases, the wide laminate conductor is configured to provide at least 600 Amperes per turn as compared to 200 Amperes per turn for the conventional laminate conductor. The relatively high current carrying capacity is advantageous since it permits the winding to be formed of fewer turns, reducing labor and costs during manufacture. In addition, use of wide conductors in a superconducting coil winding permits efficient packing of turns and use of less insulation, whereby the current density (ampere-turns) is higher than for conventionally-formed windings.

BRIEF DESCRIPTION OF THE FIGURES

FIG. 6 is a perspective cross-sectional view of the three-ply HTS electrical conductor.

FIG. 7 is a cross-sectional view of the HTS insert.

FIG. 9 is a perspective cross-sectional view of the four-ply HTS electrical conductor.

DETAILED DESCRIPTION

Figure 1:
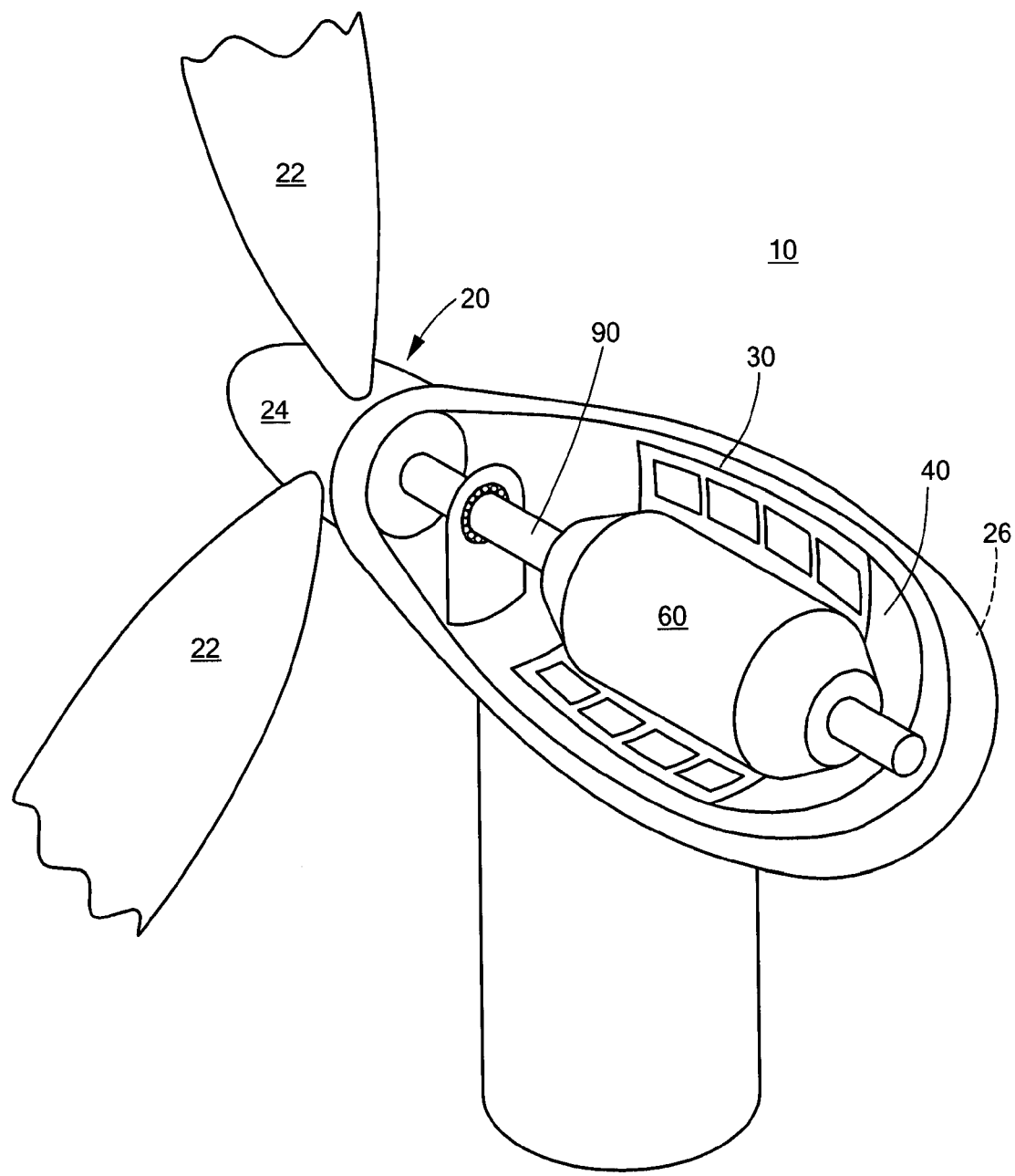
FIG. 1 is a perspective view of a wind turbine.

Referring to FIG. 1, a wind turbine 10 includes a turbine rotor 20 having blades 22 connected to a hub 24. The wind turbine 10 also includes an electrical generator 30 which is driven by a drive shaft 90 that extends between the generator 30 and the hub 24. The generator 30 is housed in a nacelle 26, shown partially cut away with the turbine rotor 20 protruding through an opening in an end of the nacelle 26. As will be described in greater detail below, the generator 30 is configured for use in low frequency applications, and rotates at the same frequency as the turbine rotor 20. For example, in the illustrated embodiment, the generator 30 is configured to operate at around 11 rpm and generate 10 Megawatts of power or more.

Figure 2:
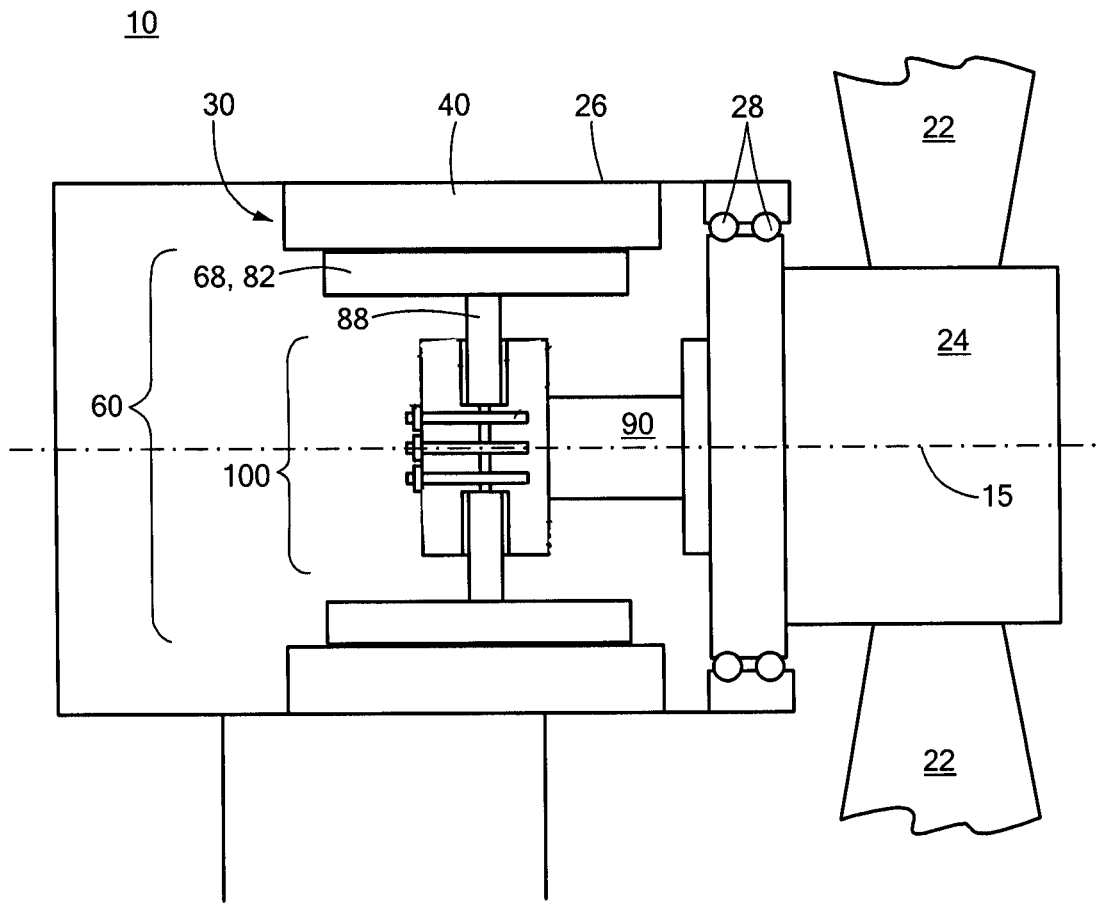
FIG. 2 is a side sectional view of the wind turbine of FIG. 1.

Referring to FIG. 2, the generator 30 is a direct-drive, synchronous, rotating superconducting machine that includes a rotor assembly 60 containing an HTS field winding and a stator assembly 40 containing a non-superconducting stator winding, for example, a copper stator winding. As will be described in greater detail below, the rotor assembly 60 is supported within the stator assembly 40 so that the rotor and stator assemblies are coaxial about a drive shaft 90 and a longitudinal axis 15 of the generator 30.

Figure 3:
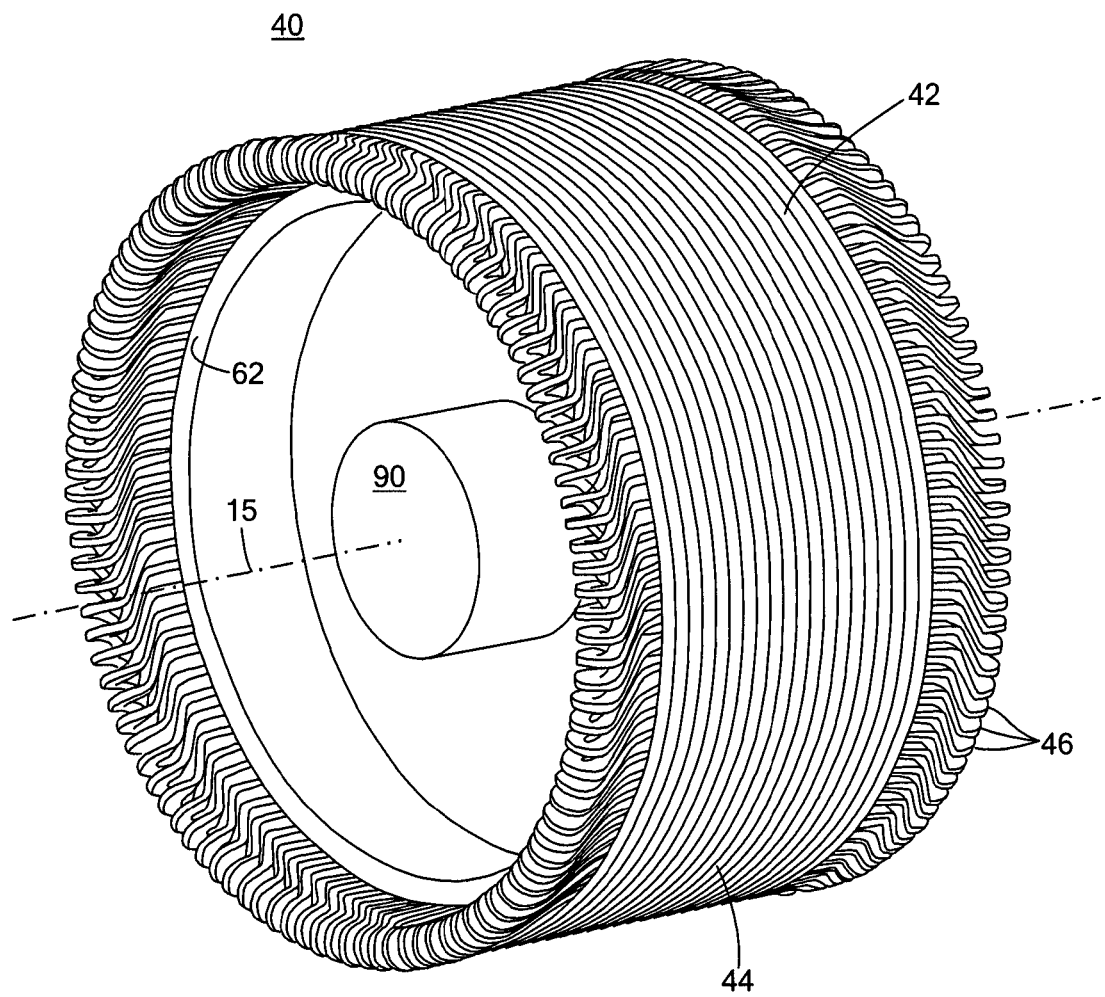
FIG. 3 is a perspective view of the generator stator assembly.

Referring to FIG. 3, the stator assembly 40 includes a stator core 42 and stator windings 46 supported within the stator core 42. The stator core 42 is a hollow cylindrical body formed as an assembly of laminated arc sections that form annular ferromagnetic plates 44. The stator windings 46 are formed of transposed wire cables (not shown), in which the individual copper wire conductors (not shown) are twisted and/or woven to form a pattern which reduces conduction losses. The transposed cables may include Litz wire, Rutherford wire, Robel wire, or any other suitable transposed or series-wound wire. The transposed cables are wound around an axis transverse to the longitudinal axis 15 of the generator 30 to form an elongated multi-turn stator winding 46 having a conventional shape such as diamond or cranked, and the stator windings 46 are cooled by conventional means.

Figure 4:
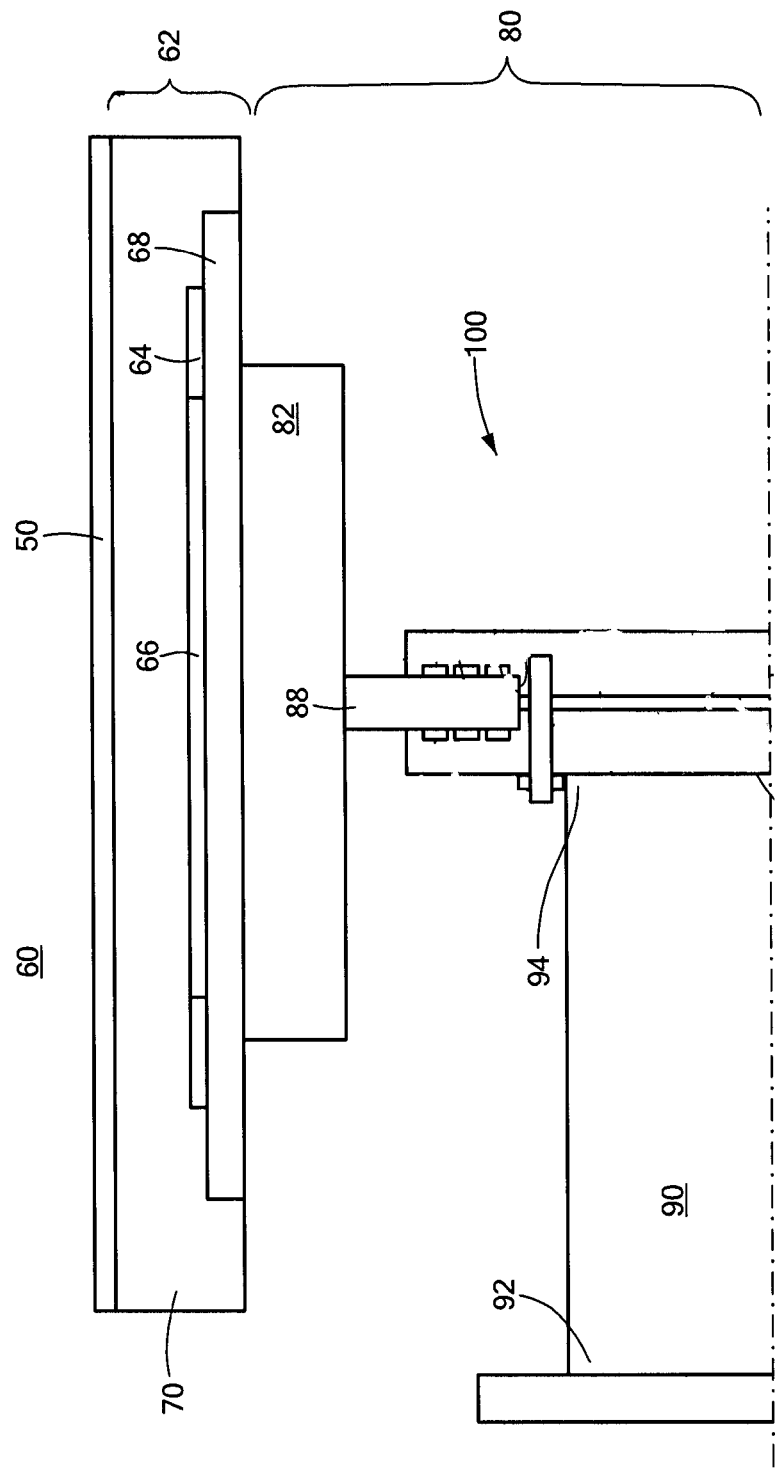
FIG. 4 is a side cross-sectional view of the generator rotor assembly.
Figure 5:
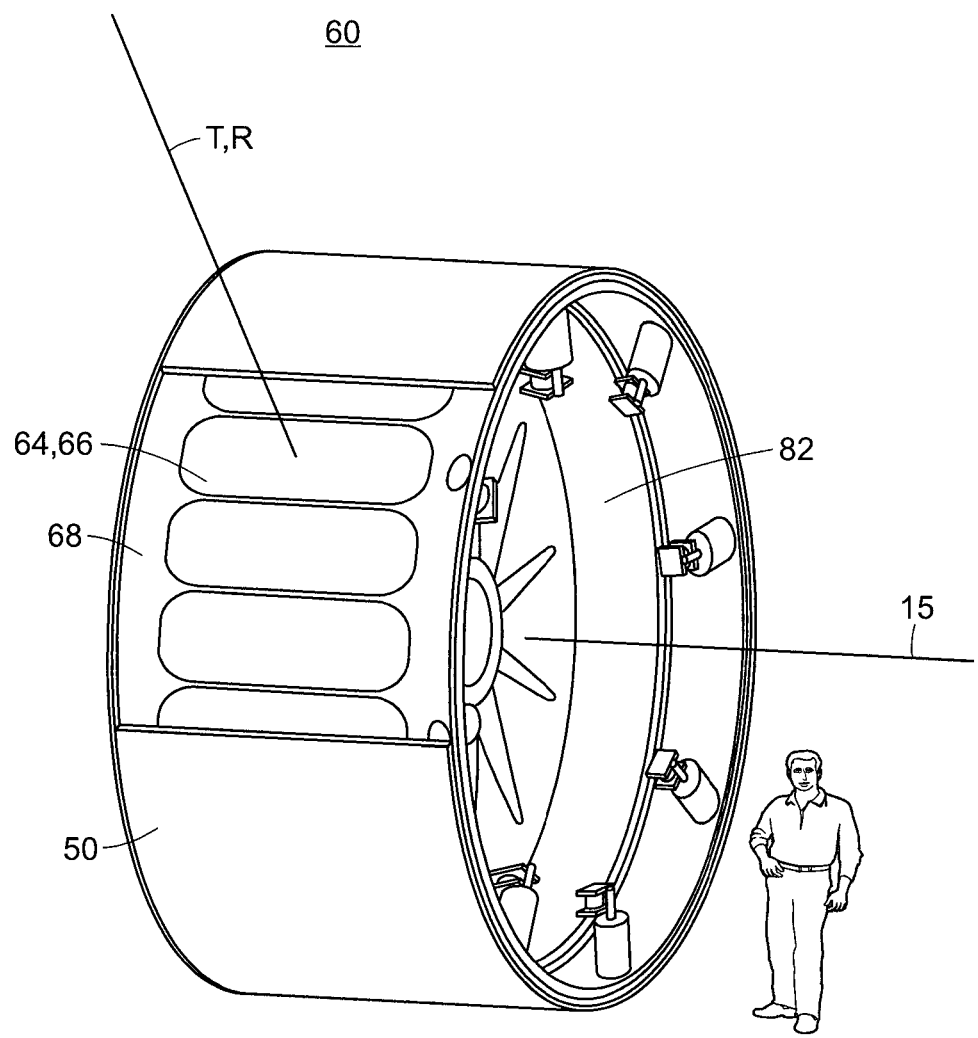
FIG. 5 is a perspective view of the generator rotor assembly.

Referring to FIGS. 4 and 5, the rotor assembly 60 includes a rotor winding assembly 62 and a torque transfer assembly 80 which are surrounded by an electromagnetic shield 50. The electromagnetic shield 50 includes a conductive, non-magnetic material that shields rotor windings 64 within the rotor winding assembly 62 by attenuating asynchronous fields produced by the stator currents. In addition, the electromagnetic shield 50 shields the rotor winding assembly 62 from heat generated in the stator assembly 40.

The rotor winding assembly 62 includes multiple rotor windings 64, each formed of a high-temperature superconductor (HTS) conductor 102 wound around a mandrel 66. Although other configurations are possible, the rotor windings 64 of this embodiment are in the form of a saddle coil, as discussed further below. The rotor windings 64 and mandrel 66 are disposed on a cylindrical rotor winding support tube 68, and the rotor windings 64, mandrel 66 and rotor winding support tube 68 are all enclosed within a cryostat 70.

The rotor windings 64 are conduction cooled through the rotor support tube 68. In the illustrated embodiment, a cryogenic cooling system as described in co-pending U.S. application Ser. No. 12/045,973, the contents of which are incorporated by reference herein, is used to cool the rotor support tube 68. In the cryogenic cooling system, cryocoolers are distributed about the circumference of the support tube 68. Each cryocooler includes a cold head connected to the rotor support tube 68, and a circulator (not shown) that circulates a coolant to and from the thermal load connected to the cryocooler, whereby the cryocooler and circulator are configured to rotate along with the rotor support tube 68.

The torque transfer assembly 80 is disposed radially inward relative to the rotor winding assembly 62, and rotatably and coaxially supports the rotor assembly 60 within the stator assembly 40. In addition, the torque transfer assembly 80 supports the rotor winding assembly 62 and transfers the rotational forces generated by the rotor winding assembly 62 to a drive shaft 90.

The torque transfer assembly 80 includes a rotor body 82 which supports and positions the support tube 68 relative to the stator assembly 40, the drive shaft 90, and a torque limiting coupling 100 which connects the rotor body 82 to the drive shaft 90. One end 94 of the drive shaft 90 is connected to the rotor body 82 via the torque limiting coupling 100. The opposed end 92 of the drive shaft 90 is supported by the nacelle 26 through support bearings 28 (best seen in FIG. 2). The rotor body 82, torque limiting coupling 100 and drive shaft 90 reside outside the cold space defined by the cryostat 70, and thus operate at ambient temperature.

Referring to FIG. 6, the saddle-type rotor winding 64 is formed of a single electrical conductor 102. The electrical conductor 102 is a high temperature superconducting (HTS) tape having a generally rectangular cross sectional shape, and a length that is much greater in dimension than its width or thickness. For purposes of this description, the conductor 102 includes an A-axis that extends in a direction corresponding to a conductor length in the direction of current transmission. The conductor 102 also includes a B-axis transverse to the A-axis, the B-axis extending in a direction corresponding to the conductor width $w_c$, and a C-axis transverse to both the A-axis and the B-axis, the C-axis extending in a direction corresponding to the conductor thickness $t_c$. It will be understood that this reference frame is set with reference to the geometry of the conductor 102 as a whole, and is separate from the crystallographic coordinates of the superconducting material provided within the conductor 102.

The conductor 102 is a laminated assembly including a first support lamina 108, a second support lamina 110, at least one HTS insert 112 disposed between the first and second support lamina 108, 110 in a layered arrangement, and a solder filler 124 that encloses the HTS insert 112, connects the HTS insert 112 to each of the first and second support lamina 108, 110, and forms a fillet 126, as discussed further below. In addition, the conductor 102 is encased within an insulative epoxy coating (not shown). The laminated conductor assembly shown in FIG. 6, which includes a single HTS insert 112, is referred to as a "three-ply" conductor.

The first and second support lamina 108, 110 are formed of an electrically conductive material such as metal, and are used to strengthen the conductor 102. For example, the first and second support lamina 108, 110 may be formed of copper, copper alloy, stainless steel, brass, or composites thereof. In the illustrated embodiment, the first support lamina 108 is formed of the same material as the second support lamina 110.

Within the conductor 102, the filler material 124 completely surrounds the insert 112. Although the filler material 124 generally fills the available space between the first support lamina 108 and the second support lamina 110, a fillet 126 is formed along the lateral edges of the filler material 124, where a shallow meniscus forms due to surface tension during manufacturing. The filler material 124 mechanically bonds all components together. Many different solders can be used as the filler material 124, and the specific solder used is selected based on the requirements (thermal, electrical and mechanical) of the particular application. For example, the filler material 124 may be selected from Pb—Sn solders, Sn solders, or other solders.

Referring to FIG. 7, the HTS insert 112 is also a laminate structure, and includes a metal substrate 120. In some embodiments, the metal substrate 120 is formed of a ferromagnetic material. For example, the metal substrate 120 may be formed of NiW. At least a surface of the metal substrate 120 is biaxially textured to provide a crystal template for one or more buffer layers 118 and the HTS layer 116. The buffer layers 118 overlie the metal substrate 120. In some embodiments, the buffer layers 118 are made up of an electrically insulating material, though electrically conductive materials can be used. The buffer layers 118 are made up of, e.g., an inert metal, an oxide, zirconate, titanate, niobate, nitride, tantalate, aluminate, cuprate, manganate, or ruthenate of a metal or rare earth element (e.g. $Al_2O_3$, $CeO_2$, $Y_2O_3$, MgO, $Gd_2O_3$, strontium titanate, gadolinium zirconate, yttria-stabilized zirconia, AlN, $Si_3N_4$, $LaMnO_4$, $La_2Zr_2O_7$, or $La_{2-x}Ce_xZr_2O_7$). Any material, or combination of materials, that provides a suitable texture on which to grow an HTS crystal can be used. The HTS layer 116 overlies the buffer layers 118 and may be any HTS material. In some embodiments, the HTS layer includes a rare earth-alkaline earth-copper oxide, such as YBCO. A cap layer 114 overlies the HTS layer 116 and protects the HTS layer from chemical and mechanical degradation. The cap layer 114 may be sputtered Ag or other inert metal. The HTS insert 112 is fabricated using a wide-strip manufacturing process that permits multiple wires to be produced in desired widths from a single 4-10 cm wide web. Thus, relatively wide conductors can be formed, permitting higher currents in a single wire.

Figure 8:
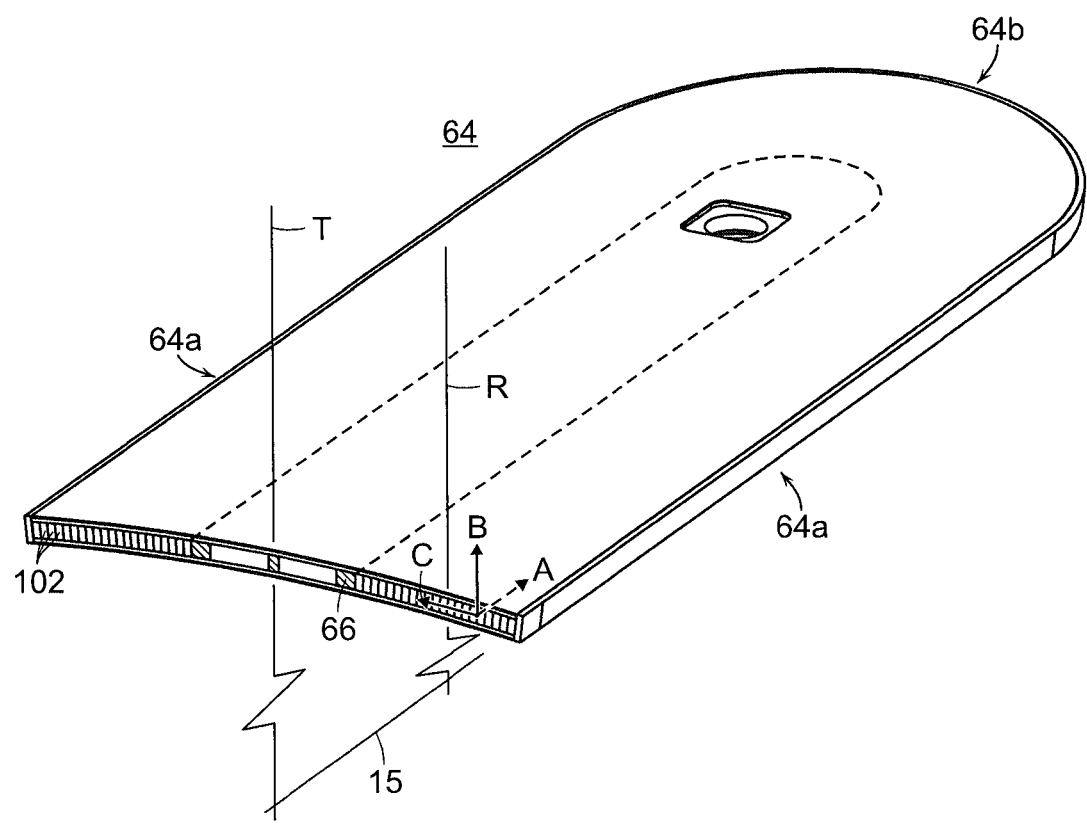
FIG. 8 is a perspective cross-sectional view of a portion of the rotor winding.

Referring to FIG. 8, in the saddle-type rotor winding 64, the conductor 102 is wound around the mandrel 66 about a T-axis that is transverse to the longitudinal axis 15 of the generator 30. Since the mandrel 66 is generally in the form of an elongated oval, the rotor winding 64 includes straight portions 64a along the long sides of the mandrel 66, and curved portions 64b along the relatively shorter, rounded ends of the mandrel 66. More particularly, in the saddle-type rotor winding 64, the conductor 102 is wound about the mandrel 66 so that within the straight portions 64a, the conductor B-axis is parallel to a radius R of the rotor assembly 60, and is normal to the outer surface of the support tube 68. It is understood that the radius R and the T-axis are coaxial in the center of the mandrel 66, and that the radius R has a slight angular deviation relative to the T-axis at locations adjacent a periphery of the mandrel 66.

In some embodiments, the conductor 102 is wound at least 300-400 turns about the T-axis. As a result, when the coil winding 64 is seen in cross-section as shown in FIG. 6, multiple layers of the conductor 102 are arranged along the C-axis of the conductor. Note that the cross-sections of conductor 102 are not drawn to scale in FIG. 8 to permit visualization of the orientation of the conductor layers within the rotor winding 64. In addition, the conductor 102 is arranged in a single layer such that the dimension of the rotor winding 64 along the radius R is the same as the B-axis dimension of the conductor 102 (e.g., the conductor width $w_c$). It is possible to form the coil winding 64 in a single layer due to its relatively large width ($w_c$). The single-layer saddle winding configuration is advantageous since it is relatively simple, more mechanically robust as compared to other configurations such as a multiple pancake stack forming an arc section, and permits very efficient packing of the conductor in the available space. One of skill in the art will appreciate that a saddle winding on a large diameter is very nearly the same as a pancake winding. However, one advantage of the saddle winding is that it conforms to the surface of a tube.

When the conductor 102 is used in coil winding applications, it has been determined that a C-axis strength of greater than 21 MPa, is critical in order to prevent delamination of the conductor, for example due to the layered arrangement of the conductor 102 along the C-axis direction to form the turns of a coil winding, and the unequal thermal contraction properties of the epoxy that surrounds the conductor 102 and the metals which form the conductor 102. In the conductor 102, the required C-axis strength is achieved by forming the conductor 102 such that the width dimension of the filler material 124 on each side of the insert 112 is at least 10 percent of a width of the conductor 102, as measured in the width direction (e.g., along the B-axis) at a location between the first support lamina 108 and second support lamina 110 corresponding to the location of the insert 112. In the three-ply conductor 102, this location generally corresponds to the mid-thickness (e.g., midpoint in the C-axis direction) of the conductor 102.

In order to obtain the required fillet thickness, the insert 112 including the HTS layer 116 is formed having an insert width $w_i$ that is less than the conductor width $w_c$. In particular, area within the conductor 102 that would conventionally be filled by superconductive material is instead filled with filler material 124, whereby current is traded in order to achieve the C-axis strength characteristics required in a rotor winding 64.

In the illustrated embodiment, the conductor 102 is formed having a conductor width $w_c$, corresponding to a width of the support lamina 108, 110, of 12.0 mm, and a thickness of 0.050 mm. In addition, the insert 112 is provided in a width $w_i$ of 9.0 mm. In particular, the insert width $w_i$ is chosen to that the smallest fillet width on each side of the insert 112 is greater than 10 percent of the conductor width $w_c$. As measured at the height location between the first support lamina and second support lamina corresponding to the location of the insert 112, the percentage of the conductor width of the total fillet width (e.g., from both sides of the insert 112) corresponds to $((w_c-w_i)/w_c)*100$. Thus the percentage of the conductor width of the fillet width on each side of the insert 112 corresponds to $((w_c-w_i)/2w_c)*100$, and is required to be at least 10 percent. Although these percentages neglect the concavity of the fillet 126, they are acceptable since the overall thickness of the conductor 102 is small, whereby the concavity is very slight. Thus, for a conductor having a conductor width $w_c$ of 12.0 mm and an insert width $w_i$ of 9.0 mm, the width dimension of the filler material 124 on each side of the insert 112 is 12.5 percent.

The conductor dimensions are not limited to the 12-9 configuration described above. For applications requiring higher current, the conductor 102 can be formed having increased insert width. For example, the conductor 102 may be formed having a conductor width $w_c$, of 16.0 mm. The corresponding insert 112 is provided in a width $w_i$ of 11.8 mm. In this example, the width dimension of the filler material 124 on each side of the insert 112 is 13 percent.

Referring to FIG. 9, an alternative embodiment conductor 202 is identical to the three-ply conductor 102 except that it includes two HTS inserts 112, 112', and is referred to as a "four-ply" conductor. By providing a conductor 202 having two inserts 112, 112', higher current carrying capacity is obtained relative to the conductor 102, which has a single insert 112.

The HTS inserts 112, 112' are structurally identical, and are arranged between the lamina in such a way that the ordering of the layers of a first of the HTS inserts 112 mirrors the ordering of the layers of the second of the HTS inserts 112' as seen across an axis through the mid-thickness of the conductor and parallel to the B-axis. In particular, the HTS inserts 112, 112' are arranged so that the ordering of the layers is generally cap layer 114/HTS layer 116/buffer layer(s) 118/ metal substrate 120/metal substrate 120'/buffer layer(s) 118'/

HTS layer 116'/cap 114'. In other words, the HTS inserts 112, 112' are arranged so that the HTS layers 116, 116' are located outward relative to the respective metal substrates 120, 120'. By this arrangement, the respective HTS layers 116, 116' electrically shield the metal substrate layers 120, 120', a configuration that lowers AC losses relative to a HTS tape configuration in which the ordering of inserts 112 is repeated, rather than mirrored, across the axis.

As discussed above, a conductor configuration that includes a wide fillet width addresses the coil winding failure mode in which a high C-axis stress that tends to delaminate the conductor is applied to the laminate due to cooling of the epoxy. In particular, delamination can be avoided by forming a conductor in which the C-axis tensile strength of the conductor is higher than the strain relief point of the epoxy. In the illustrated embodiment, for an epoxy having a strain relief point of 14 MPa, and including a safety factor of 1.5, the minimum conductor C-axis strength is 21 MPa.

In the conductor 202, the required C-axis strength is achieved by forming the conductor 202 such that the width dimension of the filler material 124 on each side of the HTS inserts 112, 112' is at least 10 percent of a width of the conductor 202, as measured in the width direction (e.g., along the B-axis) at a location between the first support lamina 108 and second support lamina 110 corresponding to the locations of the HTS inserts 112, 112'. In the four-ply conductor 102, this location generally corresponds to the mid-thickness (e.g., midpoint in the C-axis direction) of the conductor 202.

It has been experimentally determined that fillet widths of less than 10 percent on one or both sides of the insert result in conductors 102, 202 that do not reliably provide the required provide the required C-axis strength (e.g., greater than 21 MPa), and would not be suitable for use in the rotor winding 64, as discussed below with respect to FIGS. 10 and 11.

Figure 10:
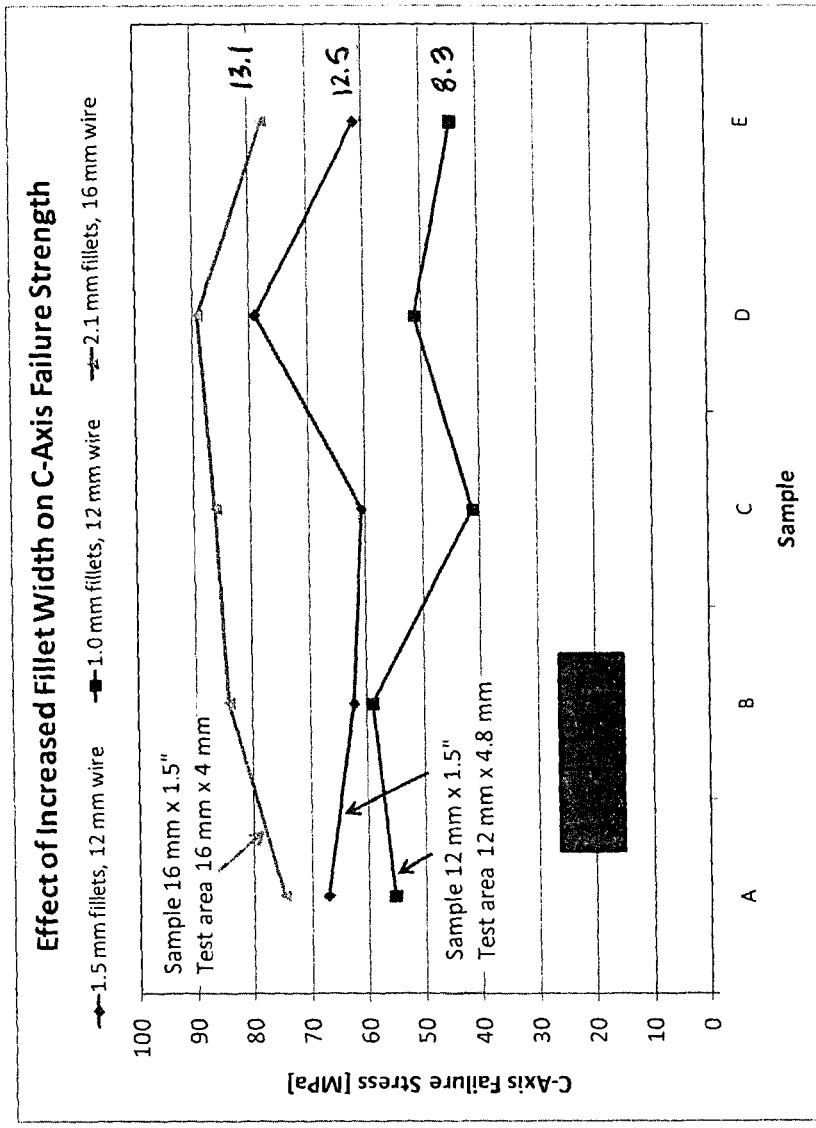
FIG. 10 is a graph illustrating measured C-axis failure stress (MPa) for five samples of three different conductor configurations.

FIG. 10 is a graph of measured C-axis failure stress for samples of the following three different configurations of a four-ply conductor: A first example conductor having a conductor width $w_c$, of 16.0 mm and an insert width $w_i$ of 11.8 mm; a second example conductor having a conductor width $w_c$, of 12.0 mm and an insert width $w_i$ of 9.0 mm; and a third example conductor having a conductor width $w_c$, of 12 mm and an insert width $w_i$ of 10 mm. The first and second example conductors have fillet widths on each side of the insert that are 13.1 percent and 12.5 percent of the conductor width, respectively. The third example conductor results in a fillet width on each side of the insert that is only 8.3 percent of the conductor width. This graph illustrates that that increasing fillet width generally results in an increased C-axis tensile failure strength.

Conventional wisdom is that there would be little improvement in strength with increased fillet width because the insert 112 is too far from the far side (outward-facing surface) of the fillet region 126. Moreover, among other things, electrical conductor technology, particularly for electrical conductors used in winding applications, is driven by the need to increase current carrying capacity. Thus, since increasing fillet width results in reduced insert width, one of skill in the art would look to solutions that increase insert size rather than decrease insert size, and would not consider increasing the fillet width. Unexpectedly, there is progressive improvement in C-axis tensile strength with increasing fillet width. This is due to the fact that the conductor edge is a crack nucleation site generated by a slitting process that occurs during manufacture of the conductor 102, 202. A wider fillet 126 provides more tensile strength right at the potential crack nucleation site.

Each of the examples shown in FIG. 10 demonstrates a C-axis tensile strength that is in excess of 21 MPa. However, as discussed below, the third example conductor does not reliably demonstrate a C-axis tensile strength that is at least 21 MPa. Thus, the third example conductor of FIG. 10, having a fillet width that is less than 10 percent, would not be suitable for use in the rotor winding 64.

Figure 11:
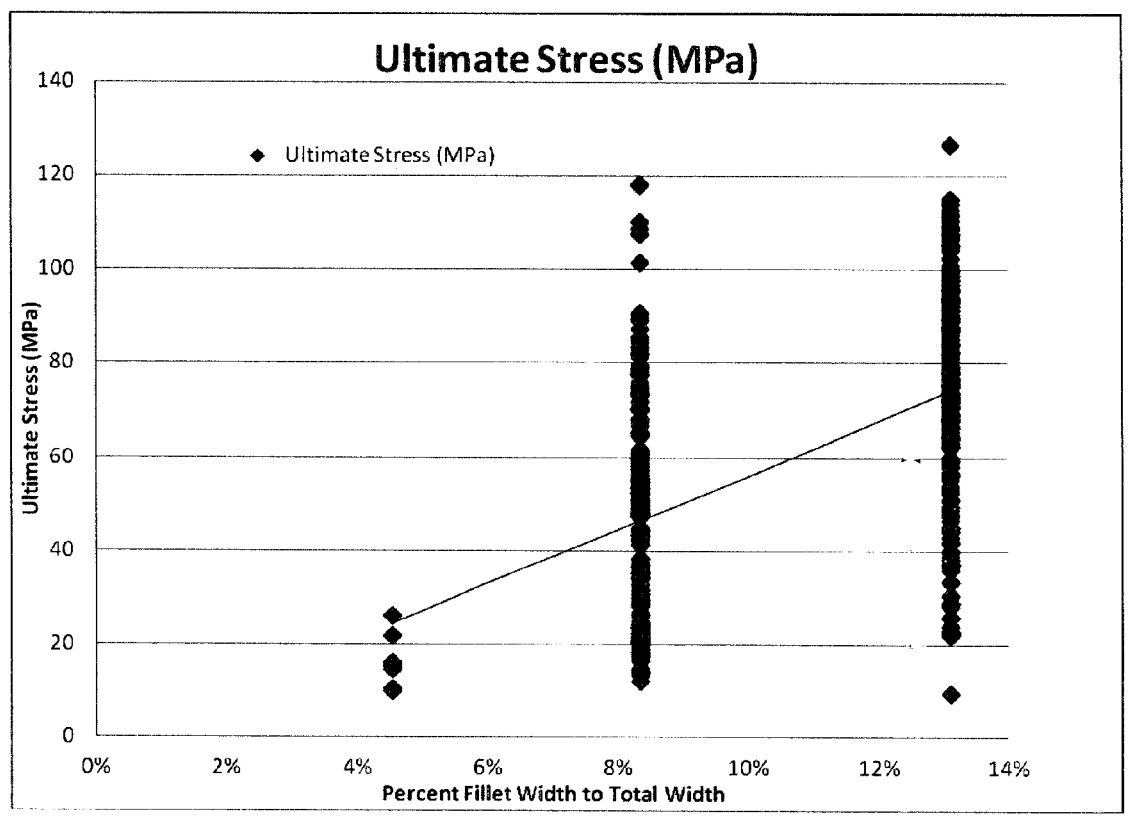
FIG. 11 is a graph illustrating measured C-axis ultimate tensile stress (MPa) versus fillet width as a percentage of total conductor width.

Referring to FIG. 11, which illustrates the relationship between fillet width (expressed as a percentage of conductor width) and ultimate tensile stress as measured in the C-axis direction, it can be seen that higher ultimate tensile stress is obtained for conductors in which the percent fillet width to total conductor width is greater. In addition, this figure illustrates that those conductors 102, 202 having fillet widths on each side of the insert 112 that are greater than 10 percent of the conductor width have a mechanical strength that is reliably greater than 21 MPa. As used herein, a conductor 102, 202 is considered to be reliable when 99.7 percent of the C-axis tensile test data lies within three standard deviations of the test data mean. In this case, at a minimum the difference between the mean conductor C-axis tensile strength and three standard deviations of the mean conductor C-axis tensile strength must be 21 MPa for the conductor 102, 202. Conductors which meet this standard have a very high probability of being reliable, and reliability is a critical feature of a coil winding since it very difficult and costly to replace a defective coil winding 64 once assembled within generator 30. In FIG. 11, the conductors having fillet widths on each side of the insert that are less than 10 percent of the conductor width, for example 4 percent and 8.3 percent, did not meet the reliability standard, and thus would not be suitable for use in the rotor winding 64.

Figure 12:
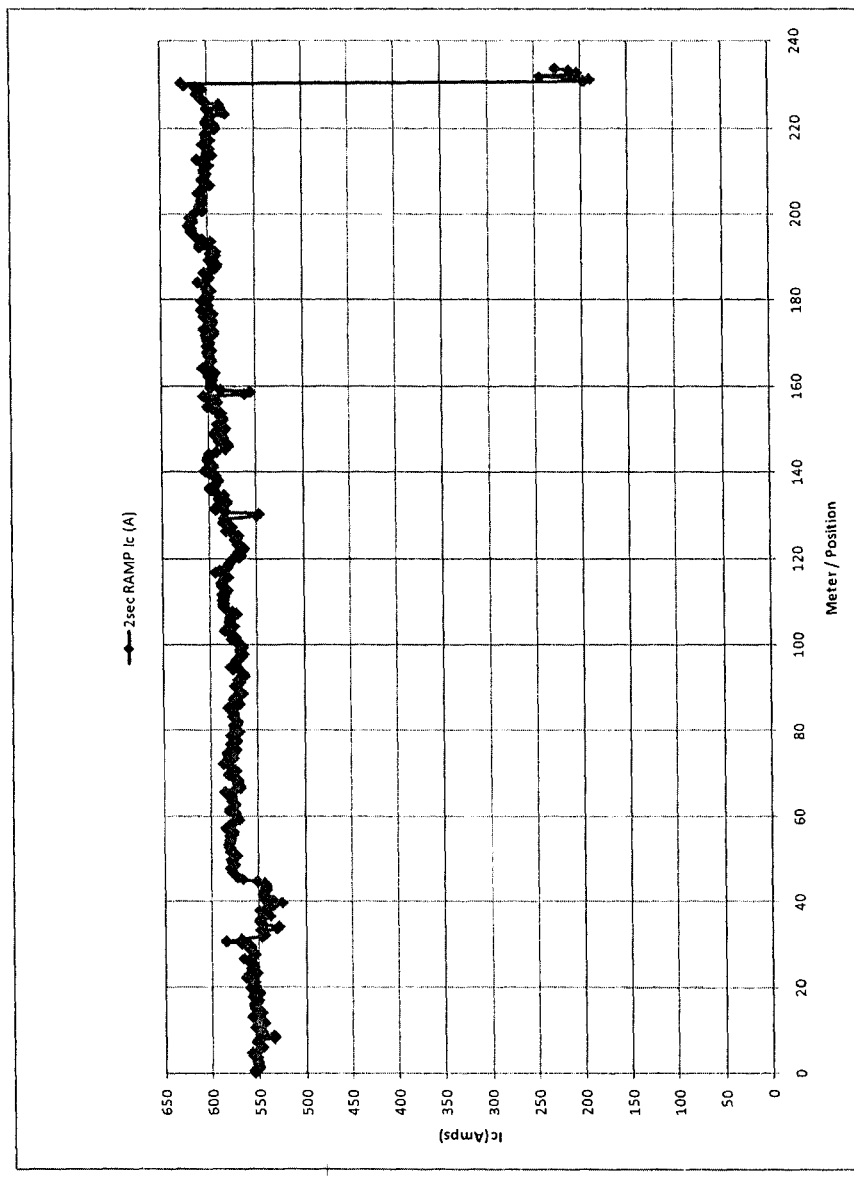
FIG. 12 is a graph of critical current (Amperes) versus position (meters) for a 16 mm wide conductor including two 11.8 mm wide inserts.

FIG. 12 is a graph of critical current Ic measured at intervals along 240 meters of a four-ply conductor 202 having a lamina width of 16 mm and insert width of 11.8. Advantageously, the conductor 202 demonstrates a high current carrying capacity (for example, a critical current Ic of about 600 Amperes), whereby a single-conductor winding 64 formed of the conductor 202 would also provide similar high current carrying capacity. As such, generator windings having multiple coils in parallel can be avoided. In addition, the critical current Ic has little variation along the length of the conductor.

It is possible to achieve the required performance from the coil winding 64 (e.g. the ability to carry 600 Amperes per turn or more) as described above due to a combination of coil winding features. In particular, the coil winding is formed of a four-ply HTS conductor 202, and the conductor 202 is formed having a large width $w_c$, for example 12 mm, 16 mm or more, as discussed further below. Each poleset is wound such that it will occupy an arc section of θ=180 degrees divided by the number of pole pairs. The large conductor width $w_c$ permits a single-layer arrangement of conductors 202 to be used within the arc section (see FIG. 8), which contributes to a very efficient and high density packing of conductors 202 within the arc (e.g. the available space). Improved packing results in higher current density, that is, more Ampere-turns, since less insulation is required. In addition, since only one conductor layer is wound for each winding 64, less labor is required during manufacture than for configurations where multiple layers are used. Also, the high conductor packing density is a configuration that promotes current self-redistribution, which results in as much as a 30 percent benefit with respect to current carrying capability. This occurs because a very wide single layer winding generally is exposed to a gradient in flux density that is parallel to the C-axis of the conductor 202 on the radial outward and inward edges of the poleset and parallel to the B-axis of the conductor 202 near the arc midpoint. Textured YBCO and BSCCO conductors carry much more current when the imposed flux density is parallel to the C-axis of the conductor. As such, the wide conductors 202 disclosed herein redistribute current from the arc edges to the arc midpoint.

An HTS machine employing the single-layer winding 64 including the four-ply conductor 202 will have a smaller size and weight relative to some conventional machines, and still provide an operating current of 600 Amperes. This can be achieved, for example, when the air gap flux density is greater than 1.5 T, the effective air gap between rotor iron and stator back iron is approximately 200 mm, and the arc section of has a single layer winding turns count greater than 400 turns for an insulated turn thickness of 400 microns.

A selected illustrative embodiment of the torque limiting coupling 100 for use in the generator 30 is described above in some detail. While this working example of the present invention has been described above, the present invention is not limited to the working example described above, but various design alterations may be carried out without departing from the present invention as set forth in the claims.

Although the conductors 102, 202 are described herein as including two support lamina 108, 110, the conductors may be formed having more than two lamina. In addition, the first support lamina 108 is not necessarily formed of the same material as the second support lamina 110. Instead, the conductors 102, 202 may include lamina formed of dissimilar materials. Although the support lamina 108, 110 are described as having a thickness of 0.050 mm, the support lamina may be formed having thicknesses other than 0.050 mm.

Although the conductors 102, 202 are described herein as having one or two inserts, the conductors are not limited to this number of inserts. In some embodiments, the conductors may be formed having more than two inserts. Moreover, normal metal may be disposed between respective inserts.

In the illustrated embodiment, the rotor windings 64 are conduction cooled through the rotor support tube 68 using a cryogenic cooling system, but conduction cooling of the rotor windings can be achieved using other techniques. For example, in other embodiments, cooling tubes are welded to the outer surface of the rotor support tube 68 intermediate the rotor windings 64. In still other embodiments, the cooling tubes may be disposed on the mandrel 66 and/or windings 64 themselves. Alternatively, other methods for cooling the rotor windings 4 may be substituted for the cooling tube arrangement. For example, in some embodiments, gaseous helium is circulated inside the cryostat 70 to cool the rotor windings 64. The coolant supply lines (not shown) that permit inward and outward flow of the gaseous helium to the rotor winding assembly 62 pass through a coaxial helium transfer coupling (not shown), which is a stationary-to-rotating union.

In addition, it should be understood that only structures considered necessary for clarifying the present invention have been described herein. Other conventional structures, and those of ancillary and auxiliary components of the system, are assumed to be known and understood by those skilled in the art.

What is claimed is:

1. A laminated electrical conductor comprising:
a first support lamina;
a second support lamina;
an insert including a high temperature superconductor disposed between the first support lamina and the second support lamina; and
a filler material surrounding the insert that bonds the insert to each of the first support lamina and the second support lamina,
wherein at the location between the first support lamina and second support lamina corresponding to the location of the insert, the width dimension of the filler material on each side of the insert is at least 10 percent of a width of the laminated electrical conductor, and
wherein the tensile strength of the laminated electrical conductor along an axis normal to the first support lamina is reliably at least 21 MPa, where the term "reliably at least 21 MPa" refers to a conductor having tensile test data along an axis normal to the first support lamina in which 99.7 percent of the tensile test data lies within three standard deviations of a mean of the tensile test data, and the difference between the mean of the tensile test data and three standard deviations of the mean of the tensile test data is at least 21 MPa.

2. The laminated electrical conductor of claim 1, wherein the filler material is solder.

3. The laminated electrical conductor of claim 1, wherein at least one of the first support lamina and the second support lamina is formed of an electrically conductive material.

4. The laminated electrical conductor of claim 1, wherein the first support lamina is formed of a different material than the second support lamina.

5. The laminated electrical conductor of claim 1, further comprising a second insert including a high temperature superconductor disposed between the first support lamina and the second support lamina.

6. The laminated electrical conductor of claim 1, wherein at least one of the first support lamina and the second support lamina has a width of at least 12 mm, and the insert has a width of at least 9 mm.

7. The laminated electrical conductor of claim 1, wherein at least one of the first support lamina and the second support lamina has a width of at least 16 mm, and the insert has a width of at least 11.8 mm.

8. A laminated electrical conductor having an A-axis extending in a direction corresponding to a conductor length, a B-axis transverse to the A-axis, the B-axis extending in a direction corresponding to a conductor width; and a c axis transverse to both the A-axis and the B-axis, the C axis extending in a direction corresponding to a conductor thickness, the laminated electrical conductor comprising:
a first support lamina having a width corresponding to the laminated electrical conductor width;
a second support lamina arranged in a layered configuration along the C axis relative to the first support lamina;
an insert including a high temperature superconductor disposed between the first support lamina and the second support lamina; and
a filler material surrounding the insert that bonds the insert to each of the first support lamina and the second support lamina,
wherein at the location between the first support lamina and second support lamina corresponding to the location of the insert, the width dimension of the filler material on each side of the insert is at least 10 percent of a width of the laminated electrical conductor, and
wherein the C-axis tensile strength of the laminated electrical conductor is reliably at least 21 MPa, where the term "reliably at least 21 MPa" refers to a conductor having C-axis tensile test data in which 99.7 percent of the C-axis tensile test data lies within three standard deviations of a mean of the C-axis tensile test data, and the difference between the mean of the C-axis tensile test data and three standard deviations of the mean of the C-axis tensile test data is at least 21 MPa.

9. The laminated electrical conductor of claim 8, wherein the filler material is solder.

10. The laminated electrical conductor of claim 8, wherein at least one of the first support lamina and the second support lamina is formed of an electrically conductive material.

11. The laminated electrical conductor of claim 8, wherein the first support lamina is formed of a different material than the second support lamina.

12. The laminated electrical conductor of claim 8, further comprising a second insert including a high temperature superconductor disposed between the first support lamina and the second support lamina.

13. The laminated electrical conductor of claim 8, wherein at least one of the first support lamina and the second support lamina has a width of at least 12 mm, and the insert has a width of at least 9 mm.

14. The laminated electrical conductor of claim 8, wherein at least one of the first support lamina and the second support lamina has a width of at least 16 mm, and the insert has a width of at least 11.8 mm.

* * * * *